United States Patent
Pu et al.

(10) Patent No.: US 10,718,497 B2
(45) Date of Patent: Jul. 21, 2020

(54) ELECTRONIC PRODUCT WITH LIGHT EMITTING FUNCTION AND METHOD FOR MANUFACTURING THE SAME

(71) Applicants: LITE-ON ELECTRONICS (GUANGZHOU) LIMITED, Guangzhou (CN); LITE-ON TECHNOLOGY CORPORATION, Taipei (TW)

(72) Inventors: Yi-Feng Pu, Taipei (TW); Tzu-Shu Lin, Taipei (TW)

(73) Assignees: LITE-ON ELECTRONICS (GUANZHOU) LIMITED, Guanzhou (CN); LITE-ON TECHNOLOGY CORPORATION, Taipei (TW)

(*) Notice: Subject to any disclaimer, the term of this patent is extended or adjusted under 35 U.S.C. 154(b) by 0 days.

(21) Appl. No.: 15/696,369

(22) Filed: Sep. 6, 2017

(65) Prior Publication Data
US 2018/0209615 A1 Jul. 26, 2018

(30) Foreign Application Priority Data
Jan. 26, 2017 (CN) .......................... 2017 1 0061629

(51) Int. Cl.
*F21V 19/00* (2006.01)
*F21V 5/00* (2018.01)
(Continued)

(52) U.S. Cl.
CPC ............ *F21V 19/002* (2013.01); *F21V 5/002* (2013.01); *F21V 7/05* (2013.01); *F21V 17/101* (2013.01);
(Continued)

(58) Field of Classification Search
CPC ........ F21V 31/00; F21V 31/005; F21V 31/03; F21V 31/04
(Continued)

(56) References Cited

U.S. PATENT DOCUMENTS

| 5,426,568 A | 6/1995 | Lamers et al. |
| 2014/0008678 A1 | 1/2014 | Tien et al. |

(Continued)

FOREIGN PATENT DOCUMENTS

| CN | 101308953 A | 11/2008 |
| CN | 101316001 A | 12/2008 |

(Continued)

OTHER PUBLICATIONS

Office Action dated May 28, 2019 by China National Intellectual Property Administration, pp. 1-10.

(Continued)

*Primary Examiner* — Edwyn Labaze
(74) *Attorney, Agent, or Firm* — McClure, Qualey & Rodack, LLP

(57) ABSTRACT

An electronic product with a light emitting function is provided. The electronic product includes a supporting structure, a light emitting structure and a cavity. The light emitting structure is bonded on the supporting structure. The light emitting structure includes a film, a conductive circuit and a light emitting device. The conductive circuit is formed on the film. The conductive circuit is enclosed between the supporting structure and the film. The light emitting device is disposed on the conductive circuit. The cavity is formed between the supporting structure and the light emitting structure, and the light emitting device is received in the cavity.

25 Claims, 13 Drawing Sheets

(51) Int. Cl.
- *F21V 23/00* (2015.01)
- *F21V 17/10* (2006.01)
- *F21V 31/00* (2006.01)
- *F21V 7/05* (2006.01)
- *H01L 33/60* (2010.01)
- *H01L 33/48* (2010.01)
- *H05K 1/18* (2006.01)
- *F21Y 115/10* (2016.01)
- *H05K 1/02* (2006.01)

(52) U.S. Cl.
CPC .......... *F21V 23/001* (2013.01); *F21V 31/005* (2013.01); *H01L 33/486* (2013.01); *H01L 33/60* (2013.01); *H05K 1/181* (2013.01); *H05K 1/189* (2013.01); *F21Y 2115/10* (2016.08); *H01L 2933/0033* (2013.01); *H01L 2933/0058* (2013.01); *H01L 2933/0091* (2013.01); *H05K 1/0204* (2013.01); *H05K 2201/10106* (2013.01); *H05K 2203/1316* (2013.01)

(58) Field of Classification Search
USPC .................. 362/267, 257, 306, 310
See application file for complete search history.

(56) References Cited

U.S. PATENT DOCUMENTS

| | | | |
|---|---|---|---|
| 2015/0076536 A1* | 3/2015 | Ou | H01L 27/15 257/91 |
| 2015/0221623 A1* | 8/2015 | Tischler | H01L 25/165 257/89 |
| 2015/0333233 A1* | 11/2015 | Washizu | H01L 33/505 257/98 |
| 2016/0138774 A1* | 5/2016 | Joo | H01L 33/58 362/84 |

FOREIGN PATENT DOCUMENTS

| | | |
|---|---|---|
| CN | 103065180 A | 4/2013 |
| CN | 103531699 A | 1/2014 |
| CN | 103899934 A | 7/2014 |
| CN | 104291016 A | 1/2015 |
| CN | 104853541 A | 8/2015 |

OTHER PUBLICATIONS

CN Office Action dated Mar. 16, 2020 in Chinese application (No. 201710061653.4).

* cited by examiner

ELECTRONIC PRODUCT WITH LIGHT EMITTING FUNCTION AND METHOD FOR MANUFACTURING THE SAME

This application claims the benefit of People's Republic of China application Serial No. 201710061629.0, filed Jan. 26, 2017, the subject matter of which is incorporated herein by reference.

BACKGROUND OF THE INVENTION

Field of the Invention

The invention relates in general to a product and a manufacturing method, and more particularly to an electronic product with a light emitting function and a method for manufacturing the same.

Description of the Related Art

Currently, electronic products with a light indicating function have become the mainstream. Conventionally, the light emitting device (such as light emitting diode, LED) is a point light source. When the LED is used as a light indicator, it is very complicated to change a point light source into a planar light source. Particularly, in a thin-type electronic product, it is very important that how to provide a uniform and viewable light indication by using a light guiding structure. Also, it has become a prominent and urgent task for the industries to increase the waterproof and dustproof functions of electronic products, such that electronic products with the light indicating function can be used in any products with various shapes and the yield rate thereof can be increased.

SUMMARY OF THE INVENTION

The invention is directed to an electronic product with a light emitting function and a method for manufacturing the same. An in-mold forming technology or an out-mold forming technology is used. A light emitting device is received in a cavity or is enclosed between a film and a light diffusion layer to enhance the protection for the light emitting device.

According to an embodiment of the present invention, an electronic product with a light emitting function is provided. The electronic product includes a supporting structure, a light emitting structure and a cavity. The light emitting structure is bonded on the supporting structure. The light emitting structure includes a film, a conductive circuit and a light emitting device. The conductive circuit is formed on the film, and is interposed between the supporting structure and the film. The light emitting device is disposed on the conductive circuit. The cavity is formed between the supporting structure and the light emitting structure. The light emitting device is received in the cavity.

According to another embodiment of the present invention, an electronic product with a light emitting function is provided. The electronic product includes a supporting structure, a light emitting structure and a light diffusion layer. The light emitting structure is bonded on the supporting structure. The light emitting structure includes a film, a conductive circuit and a light emitting device. The conductive circuit is formed on the film, and the light emitting device is disposed on the conductive circuit. The light diffusion layer covers the light emitting device and the conductive circuit. The supporting structure, the light emitting structure and the light diffusion layer are bonded and stacked to each other. The light diffusion layer is enclosed between the supporting structure and the light emitting structure or the light emitting structure is enclosed between the supporting structure and the light diffusion layer.

According to another embodiment of the present invention, a manufacturing method of an electronic product is provided. The manufacturing method includes following steps. A conductive circuit is formed on a film. A light emitting device is disposed on the conductive circuit, so that a light emitting structure is constructed by the film, the conductive circuit and the light emitting device. A supporting structure is formed, and the light emitting structure is bonded on the supporting structure. A cavity is formed between the supporting structure and the light emitting structure, and the light emitting device is received in the cavity.

According to another embodiment of the present invention, a manufacturing method of an electronic product is provided. The manufacturing method includes following steps. A conductive circuit is formed on a film. A light emitting device is disposed on the conductive circuit, so that a light emitting structure is constructed by the film, the conductive circuit and the light emitting device. A light diffusion layer is formed to cover the light emitting device and the conductive circuit. A supporting structure is formed, and the supporting structure, the light emitting structure and the light diffusion layer are bonded and stacked to each other, and the light diffusion layer is enclosed between the supporting structure and the light emitting structure or the light emitting structure is enclosed between the supporting structure and the light diffusion layer.

The above and other aspects of the invention will become better understood with regard to the following detailed description of the preferred but non-limiting embodiment(s). The following description is made with reference to the accompanying drawings.

DETAILED DESCRIPTION OF THE INVENTION

Detailed descriptions of the invention are disclosed below with a number of embodiments. However, the disclosed embodiments are for explanatory and exemplary purposes only, not for limiting the scope of protection of the invention.

Figure 1A:
FIGS. 1A-1C are schematic diagrams of forming a conductive circuit by way of hot stamping according to a first embodiment of the invention.
Figure 1B:
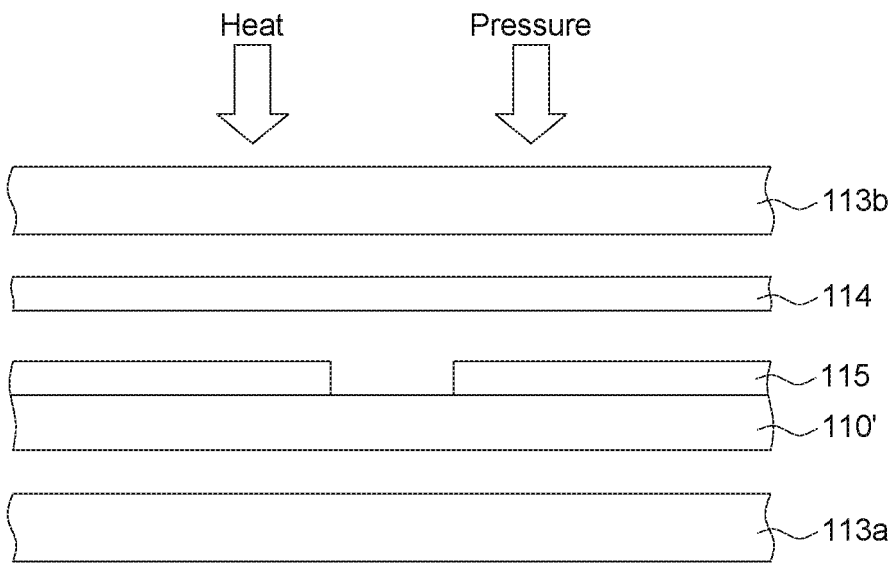
Figure 1C:
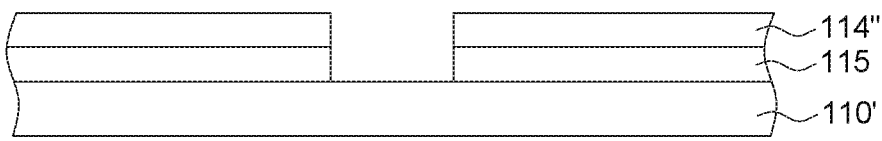

Refer to FIGS. 1A-1C. The method for forming a conductive circuit 114" by way of hot stamping according to an embodiment of the invention includes following steps. As indicated in FIG. 1A, a patterned ink layer 115 is formed on a polymer film 110' by a printing or transferring process. The ink may contain at least one conductive powder (such as F-Fe3O4 crystalline powder), at least one polymer resin, a charge regulator, a flow agent and at least one surface modifier. Then, as indicated in FIG. 1B, stamping plates 113a and 113b are formed of metal (such as zinc or copper). Firstly, before the hot stamping process is performed, the stamping plate 113b is heated by a heater, and the stamping plate 113a may be heated by a heater to increase the uniformity of heat, but also may not be heated and just used for fixing. Then, the conductive metal layer 114 is placed on the patterned ink layer 115 and is heated and pressed through the stamping plate 113b disposed above the conductive metal layer 114, such that a part of the conductive metal layer 114 is heated and fixed on the patterned ink layer 115 to form the conductive circuit 114", and the remaining part of the conductive metal layer 114 not forming the conductive circuit 114" is removed by a brush or a scraper. As indicated in FIG. 1C, after hot stamping, a part of the conductive metal layer 114 is fixed on the polymer film 110' having the patterned ink layer 115 to form the conductive 114" having a circuit pattern on the polymer film 110'.

Figure 2A:
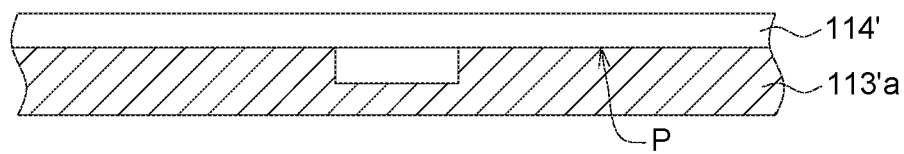
FIGS. 2A-2C are schematic diagrams of forming a conductive circuit by way of hot stamping according to a second embodiment of the invention.
Figure 2B:
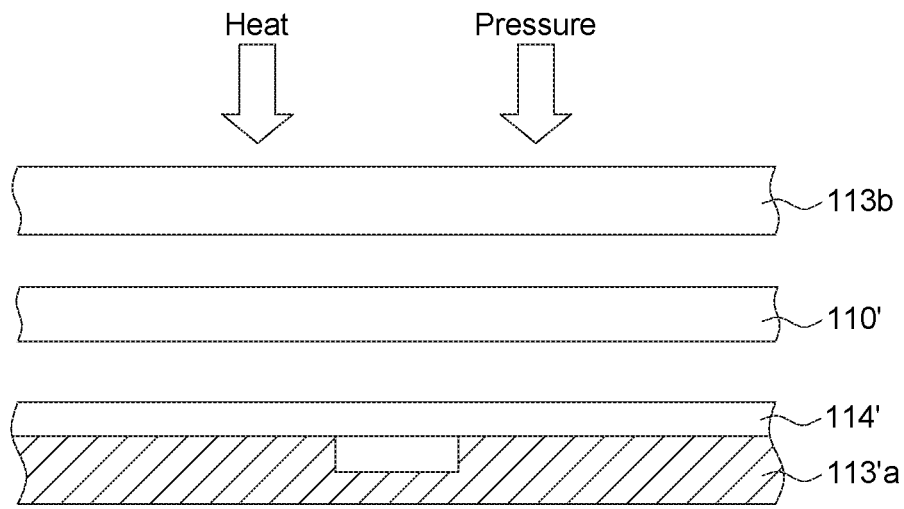
Figure 2C:
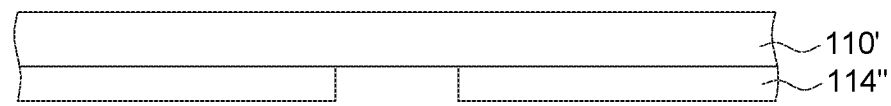

Refer to FIGS. 2A-2C. The method for forming a conductive circuit 114" by way of hot stamping according to an embodiment of the invention includes following steps. As indicated in FIG. 2A, a conductive metal layer 114' is formed on a Toppan stamping plate 113'a, and a circuit pattern is formed through the protrusion P of the Toppan stamping plate 113'a, and the conductive metal layer 114' contains an adhesive which provides the conductive metal layer 114' with viscosity. As indicated in FIG. 2B, firstly, before the hot stamping process is performed, the Toppan stamping plate 113'a is heated by a heater, and the stamping plate 113b can be heated to increase the uniformity of heat, but also cannot be heated and just used for fixing. Then, a polymer film 110' is placed on the conductive metal layer 114', and is heated and pressed through the Toppan stamping plate 113'a for transferring the heat to the conductive metal layer 114' to heat and melt the adhesive, such that a part of the conductive metal layer 114' is fixed on the polymer film 110' by the melted adhesive. As indicated in FIG. 2C, after hot stamping, a part of the conductive metal layer 114' forms the conductive circuit 114" having the circuit pattern on the polymer film 110'.

Figure 3A:
FIGS. 3A-3C are schematic diagrams of forming a conductive circuit by way of hot stamping according to a third embodiment of the invention.
Figure 3B:
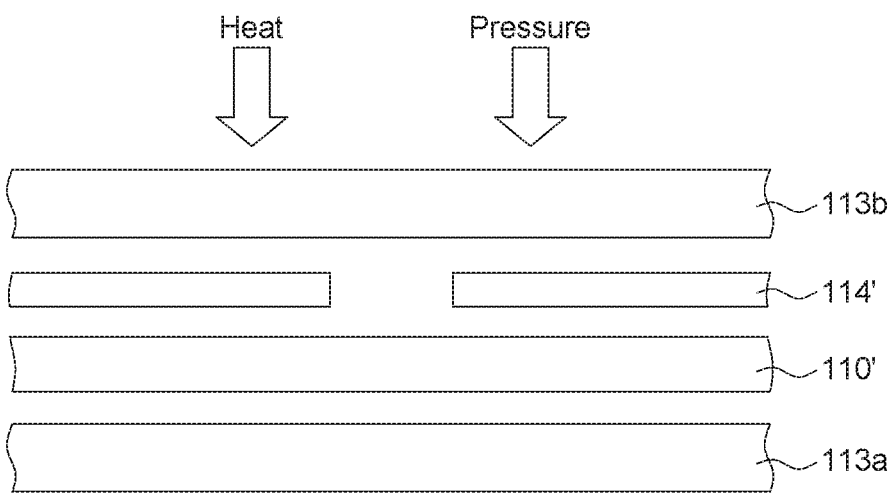
Figure 3C:

Refer to FIGS. 3A-3C. The method for forming a conductive circuit 114" by way of hot stamping according to an embodiment of the invention includes following steps. As indicated in FIG. 3A, a conductive metal layer 114' having a circuit pattern is formed, and the conductive metal layer 114' contains an adhesive which provides the conductive metal layer 114' with viscosity. Then, as indicated in FIG. 3B, firstly, before the hot stamping process is performed, the stamping plate 113b is heated by a heater, and the stamping plate 113a may be heated to increase the uniformity of heat, but also may not be heated and just used for fixing. Then, the conductive metal layer 114' is heated and pressed through the stamping plate 113b disposed above the conductive metal layer 114' to heat and melt the adhesive, such that the conductive metal layer 114' having the circuit pattern is fixed on the polymer film 110' by the melted adhesive. As indicated in FIG. 3C, after hot stamping, the conductive metal layer 114' having the circuit pattern forms the conductive circuit 114" having the circuit pattern on the polymer film 110'.

Figure 4A:
FIGS. 4A-4C are schematic diagrams of forming a conductive circuit by way of cold stamping according to a fourth embodiment of the invention.
Figure 4B:
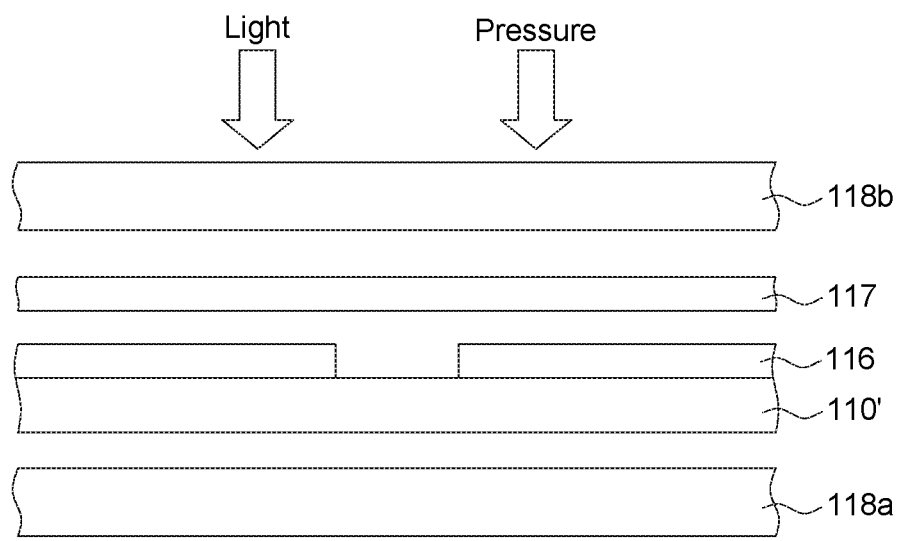
Figure 4C:
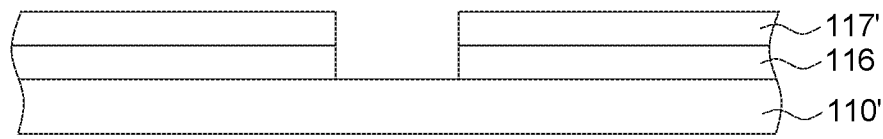

Refer to FIGS. 4A-4C. The method for forming a conductive circuit 117' by way of cold stamping according to an embodiment of the invention includes following steps. As indicated in FIG. 4A, a patterned adhesive layer 116 (such as a UV curing adhesive) is formed on a polymer film 110' by way of printing or adhering. As indicated in FIG. 4B, a conductive metal layer 117 is disposed on the patterned adhesive layer 116. The polymer film 110' and the conductive metal layer 117 are placed between the pressure plates 118a and 118b and are pressed through the pressure plate 118b, such that a part of the conductive metal layer 117 is pressed and fixed on the patterned adhesive layer 116 to form the conductive circuit 117', the patterned adhesive layer 116 is irradiated by a UV light and cured, and the remaining part of the conductive metal layer 117 not forming the conductive circuit 117' is removed by a brush or a scraper. As indicated in FIG. 4C, after cold stamping, a part of the conductive metal layer 117 is fixed on the polymer film 110' having the patterned adhesive layer 116 to form the polymer film 110' having the conductive circuit 117'.

Figure 5A:
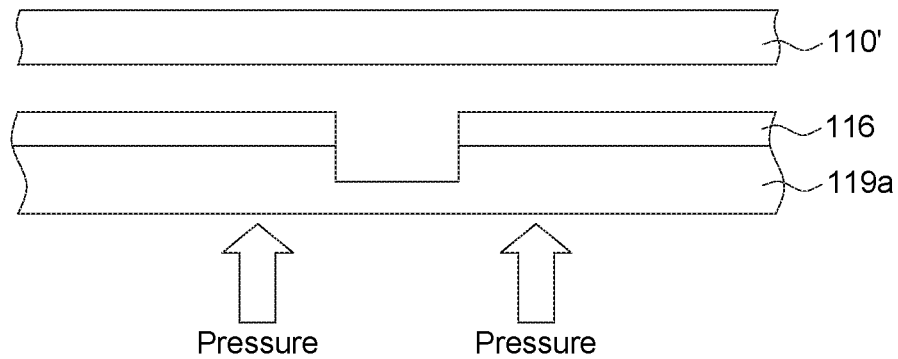
FIGS. 5A-5C are schematic diagrams of forming a conductive circuit by way of cold stamping according to a fifth embodiment of the invention.
Figure 5B:
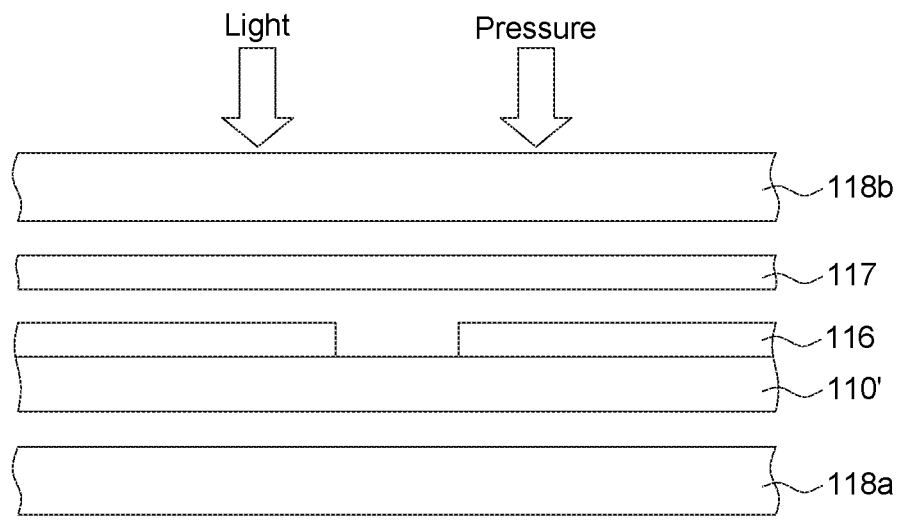
Figure 5C:
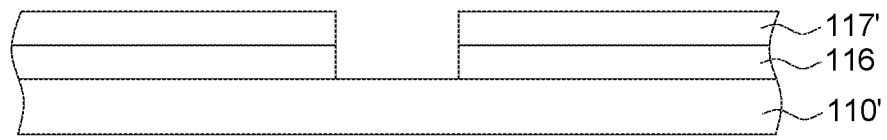

Refer to FIGS. 5A-5C. The method for forming a conductive circuit 117' by way of cold stamping according to an embodiment of the invention includes following steps. As indicated in FIG. 5A, an adhesive layer 116 (such as a UV curing adhesive) is adhered on a protrusion P of a Toppan pressure plate 119a. A circuit pattern is formed through the protrusion P of the Toppan pressure plate 119a to form the pattern of the patterned adhesive layer 116. Then, the polymer film 110' is placed on the patterned adhesive layer 116, and the patterned adhesive layer 116 is transferred to the polymer film 110' by way of pressing. As indicated in FIG. 5B, the conductive metal layer 117 is disposed on the patterned adhesive layer 116 and is pressed through the pressure plates 118a and 118b, such that a part of the conductive metal layer 117 is pressed and fixed on the patterned adhesive layer 116 to form the conductive circuit 117'. The patterned adhesive layer 116 is irradiated by a UV light and cured, and the remaining part of the conductive metal layer 117 not forming the conductive circuit is removed by a brush or a scraper. As indicated in FIG. 5C, after cold stamping, a part of the conductive metal layer 117 is fixed on the polymer film 110' having the patterned adhesive layer 116 to form the conductive circuit 117' having the circuit pattern on the polymer film 110'.

Figure 6A:
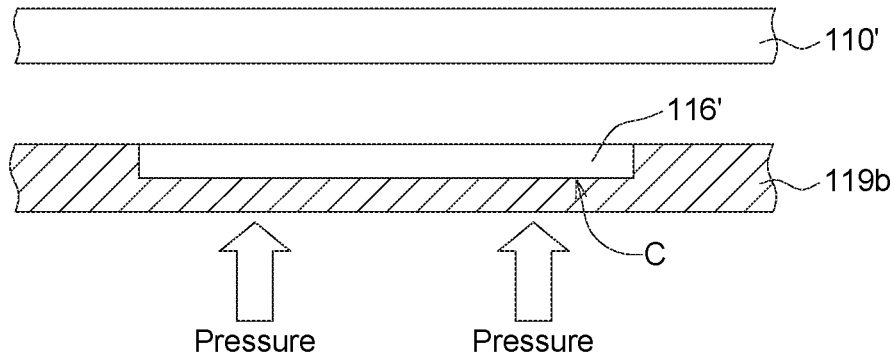
FIGS. 6A-6C are schematic diagrams of forming a conductive circuit by way of cold stamping according to a sixth embodiment of the invention.
Figure 6B:
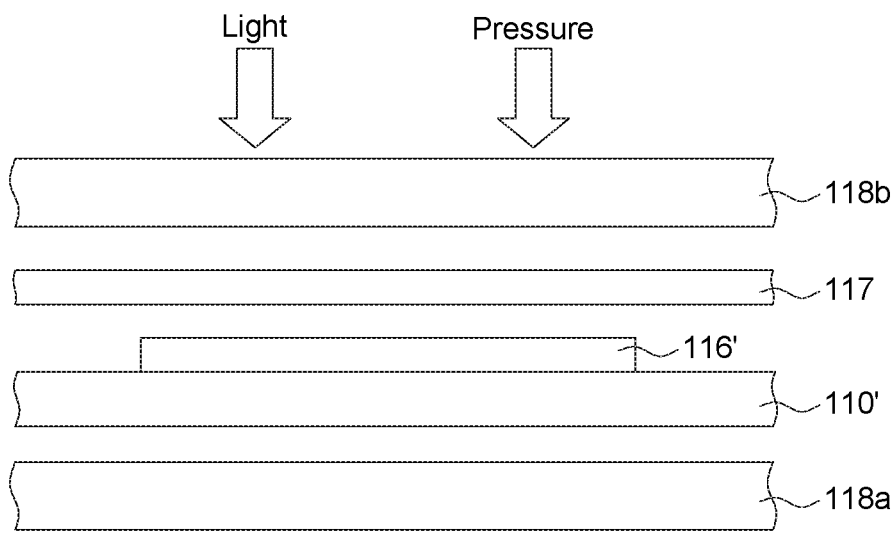
Figure 6C:
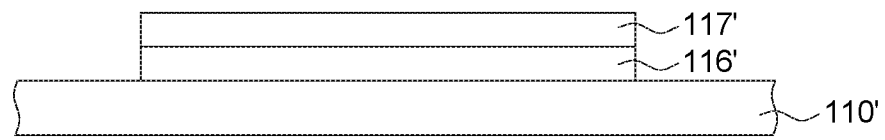

Refer to FIGS. 6A-6C. The method for forming a conductive circuit 117' by way of cold stamping according to an embodiment of the invention includes following steps. As indicated in FIG. 6A, an adhesive layer 116' (such as an UV curing adhesive) is filled into a groove C of the Intaglio pressure plate 119b, and a circuit pattern is formed through the groove C of the Intaglio pressure plate 119 to form the pattern of the patterned adhesive layer 116', the polymer film 110' is disposed on the patterned adhesive layer 116', and the patterned adhesive layer 116' is transferred on the polymer film 110' by way of pressing. The conductive metal layer 117 is disposed on the patterned adhesive layer 116', and the conductive metal layer 117 enclosed between the pressure plates 118a and 118b is pressed through the pressure plate 118b, such that a part of the conductive metal layer 117 is pressed and fixed on the patterned adhesive layer 116' to form the conductive circuit. The patterned adhesive layer 116 is irradiated by a UV light and cured, and the remaining part of the conductive metal layer 117 not forming the conductive circuit is removed by a brush or a scraper. As indicated in FIG. 6C, after cold stamping, a part of the conductive metal layer 117 is fixed on the polymer film 110' having the patterned adhesive layer 116' to form the conductive circuit 117' having the circuit pattern on the polymer film 110'.

Figure 7A:
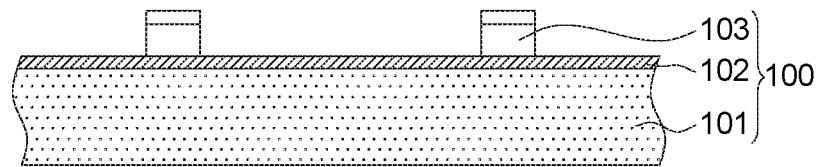
FIGS. 7A-7C are procedures of a manufacturing method of an electronic product according to an embodiment of the invention.
Figure 7B:
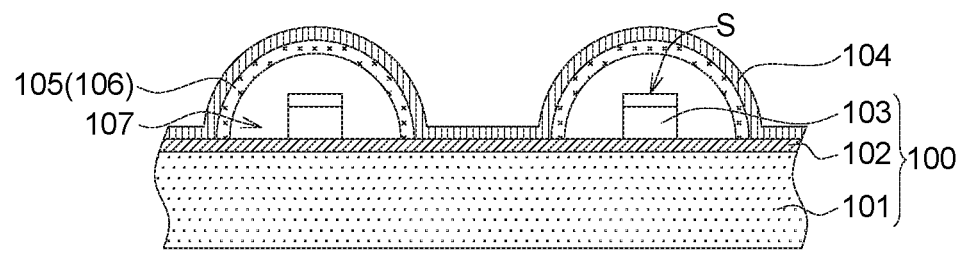
Figure 7C:
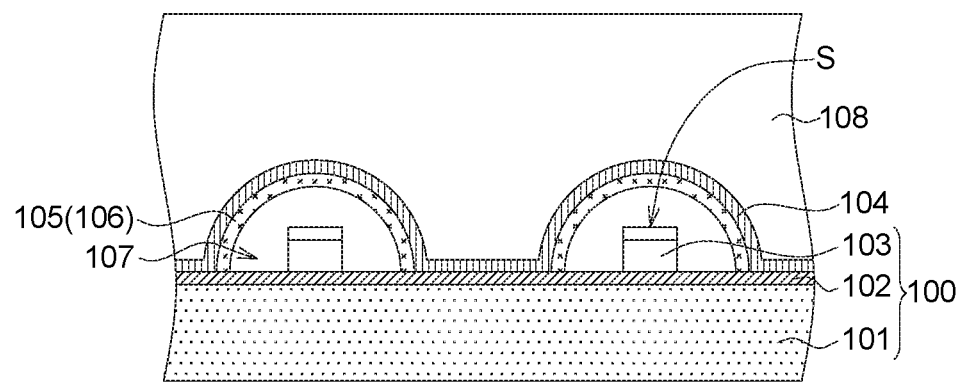

Refer to FIGS. 7A-7C. The method for manufacturing an electronic product 120 according to an embodiment of the invention includes following steps:

As indicated in FIG. 7A, a conductive circuit 102 is formed on a film 101. The conductive circuit 102 can be formed of a conductive ink or any conductive metals. The conductive ink is formed on a surface of the film 101 by way of printing. The conductive metal, which may be any conductive metal foils, such as gold, silver, copper, iron, aluminum, nickel, zinc, can be formed on a surface of the film 101 by way of hot stamping process disclosed in FIGS. 1A-1C, FIGS. 2A-2C or FIGS. 3A-FIG. 3C or can be formed on a surface of the film 101 by way of cold stamping process disclosed in FIGS. 4A-4C, FIGS. 5A-5C or FIGS. 6A-FIG. 6C. Then, a light emitting device 103 is disposed on the conductive circuit 102, and can be electrically connected to another electronic element or another electronic device through the hot stamped or cold stamped conductive circuit 102 for transmitting electrical signals. In the hot stamping process disclosed above, the sequence for heating and pressing the stamping plates 113a and 113b is not limited to the sequence exemplified in the embodiments of FIGS. 1A-1C, FIGS. 2A-2C or FIGS. 3A-3C, and other variations of the steps of heating and pressing the conductive metal by the stamping plates whether directly or indirectly can also be used. In the cold stamping process disclosed above, the sequence for pressing the pressure plates 118a and 118b is not limited to the sequence exemplified in the embodiments of FIGS. 4A-4C, FIGS. 5A-5C or FIGS. 6A-6C, and other variations of the steps of pressing the conductive metal by the pressure plates whether directly or indirectly can also be used. A light emitting structure 100 includes the film 101, the conductive circuit 102 and the light emitting device 103. In another implementation of the disclosure, the film 101 and the conductive circuit 102 can be realized by a flexible board having a conductive circuit, and the light emitting device 103 can be realized by a light emitting diode (LED), an organic light emitting diode (OLED) or other light emitting devices. The light emitting device 103 can be used as an indicator or a light source in electronic products commonly used in daily life, such as electronic appliances, consumer electronic devices and vehicle electronic products. In an embodiment, the light emitting device 103 can be electrically connected to the conductive circuit 102 through a conductive paste or a solder through which a controller (not illustrated) can transmit electrical signals to the light emitting device 103.

Refer to FIG. 7B. A cavity 107 is formed over the light emitting structure 100, and the cavity 107 covers the light emitting device 103, such that the light emitting device 103 is received in the cavity 107. Then, refer to FIG. 7C. A supporting structure 108 is formed on the light emitting structure 100, so that the light emitting structure 100 and the supporting structure 108 are bonded together, and the cavity 107 is enclosed between the light emitting structure 100 and the supporting structure 108. In the present embodiment, the cavity 107 is formed by a concave plate 104, which covers the surrounding of the light emitting device 103 and is disposed on the conductive circuit 102 (as indicated in the diagram) or the film 101 (not illustrated). The concave plate 104 is a rigid structure (such as a hard casing) capable of receiving an external force to avoid the light emitting device 103 colliding with the injected plastics and becoming damaged. The concave plate 104 is formed by using at least one of an injection process, a casting process, a turning process, a stamping process and a compressing process to form the required shape. The shape of the concave plate 104 is not limited to a semi-circular shape. For example, the concave plate 104 may have a rectangular shape or a V shape. The structure of the concave plate 104 can be different from the jointly complete semi-circular structure illustrated in FIG. 7B. For example, the concave plate 104 can be one of semi-circular structures covering one of the light emitting devices 103 independently. Additionally, the concave plate 104 can be a translucent structure, and the light output surface S of the light emitting device 103 can emit a light towards the concave plate 104, such that the light can further pass through the concave plate 104. Moreover, the supporting structure 108 and/or the film 101 can also be a translucent structure, such that the light can pass through the supporting structure 108 and/or the film 101.

In an embodiment, the supporting structure 108 and the light emitting structure 100 can be bonded together by using an in-mold forming technology, and the supporting structure 108 can be formed of a polymer plastic material. As indicated in FIG. 7B, the film 101 and the concave plate 104 can be pre-bonded together by using a high temperature vacuum adsorption method, a heat pressing method, an ultrasonic welding method, a gluing method or an adhesive attaching method. The concave plate 104 covers the surrounding of the light emitting device 103, such that the light emitting device 103 is enclosed between the concave plate 104 and the film 101. Then, the in-mold forming method is conducted, as indicated in FIG. 7C, the light emitting structure 100 having the concave plate 104 is placed in the mold, and the polymer plastic material is melted at high temperature and injected into the mold. Then, the polymer plastic material cools down to form a supporting structure 108 required by the electronic product 120, such that the supporting structure 108 and the light emitting structure 100 having the concave plate 104 are bonded together. Meanwhile, the concave plate 104 is enclosed between the light emitting device 103 and the supporting structure 108 to avoid the light emitting device 103 colliding with the injected plastic material and becoming damaged.

As indicated in FIG. 7C, the inner wall of the cavity 107 can selectively have a light scattering structure 105 or a light diffusion layer 106 disposed thereon and facing the light output surface S of the light emitting device 103. The light scattering structure 105 can be micro-structures, prism structures or multi-curve lens structures formed on the concave plate 104. The light scattering structure 105 or the light diffusion layer 106 can enlarge the output angle of the light to scatter or deflect the light and increase the uniformity of the light.

Figure 8A:
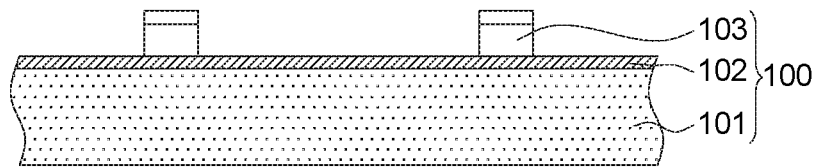
FIGS. 8A-8C are procedures of a manufacturing method of an electronic product according to an embodiment of the invention.
Figure 8B:
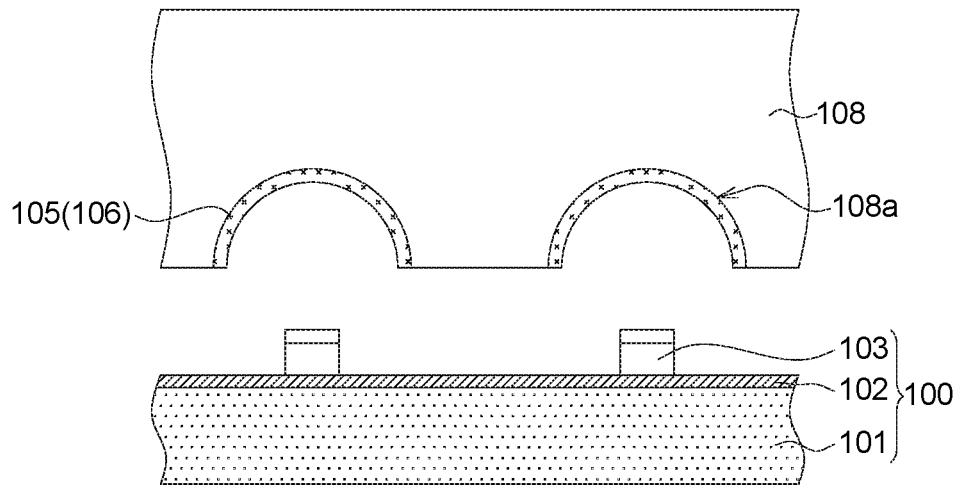
Figure 8C:
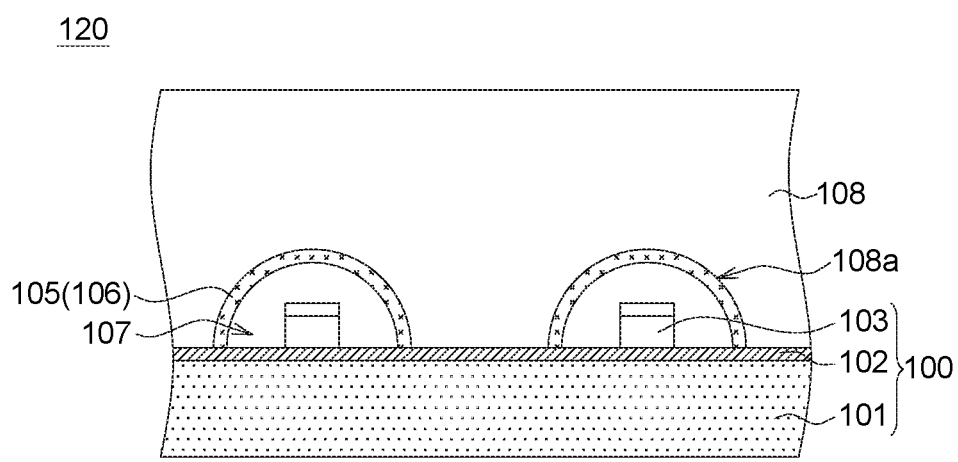

Refer to FIGS. 8A-8C. The manufacturing method of the electronic product 120 of FIGS. 8A-8C is similar to the manufacturing method of the electronic product 120 of FIGS. 7A-7C, and common components retain the same numeric designation. The differences between the two manufacturing methods are disclosed below. As indicated in FIG. 8B, the cavity 107 is formed by a notch 108a indented into the supporting structure 108, and the inner wall of the cavity 107 can selectively have a light scattering structure 105 or a light diffusion layer 106 disposed thereon. The light scattering structure 105 or the light diffusion layer 106 can enlarge the output angle of the light to scatter or deflect the light and increase the uniformity of the light. In an embodiment, the supporting structure 108 is formed by using at least one of an injection process, a casting process, a turning process, a stamping process and a compressing process to form the required notch 108a. The shape of the notch 108a is not limited to a semi-circular shape. For example, the notch can have a rectangular shape or an inverted V shape.

Besides, as indicated in FIG. 8C, the film 101 and the supporting structure 108 can be bonded by using an out-mold forming technology, which may include an out-mold packaging method, a high temperature vacuum adsorption method, a heat pressing method, an ultrasonic welding method, a gluing method or an adhesive attaching method. According to the out-mold packaging method, the polymer film is bonded on the supporting structure 108 through the use of a positioning system under the conditions of specific temperature, vacuum state, and pressure, and the film 101 is heated, deformed and tightly attached on the supporting structure 108. That is, the film 101 of the light emitting structure 100 can be realized by a thermo-formable film, such as a film formed of a polymer plastic material. By using the said out-mold forming technology, the thermo-formable film is tightly bonded on the supporting structure 108. Unlike the in-mold forming technology which needs to perform a forming procedure inside the mold at high temperature and high pressure, the out-mold forming technology of the present embodiment can reduce the adverse effects, such as high melting temperature, high molding temperature, high forming pressure and high injection speed, generated during the in-mold injection forming process, and therefore increase the yield rate of the electronic product 120.

Figure 9A:
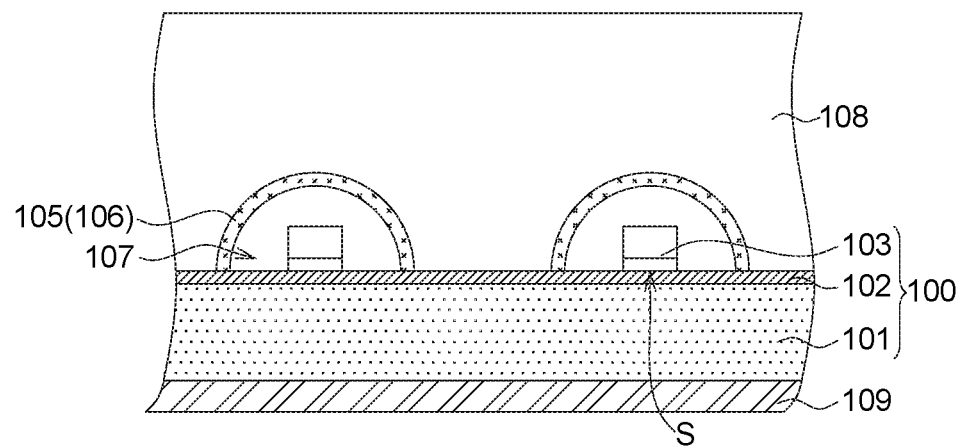
FIG. 9A is a schematic diagram of an electronic product according to another embodiment of the invention.

Refer to FIG. 9A. The electronic product 121 and the electronic product 120 disclosed in above embodiments have similar structures, but are different as follows. The surface of the film 101 further has a reflective layer 109 disposed thereon for reflecting the light. The reflective layer 109 is coated or attached on the film 101. The conductive circuit 102 can be formed by a translucent conductive material or have an opening allowing the light to pass therethrough, such that the light generated by the light emitting device 103 can emit from the light output surface S of the light emitting device 103 towards the reflective layer 109, and then the light is reflected upward by the reflective layer 109 to enter the supporting structure 108 and then is emitted from the outer surface of the supporting structure 108 to increase optical effects.

Figure 9B:
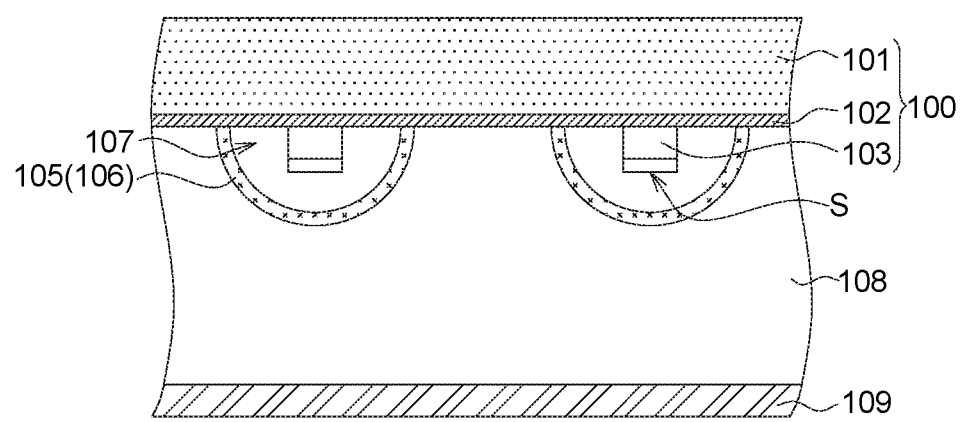
FIG. 9B is a schematic diagram of an electronic product according to another embodiment of the invention.

Refer to FIG. 9B. The electronic product 122 of FIG. 9B and the electronic product 121 of FIG. 9A have similar structures but are different as follows. The surface of the supporting structure 108 further has a reflective layer 109 disposed thereon. The reflective layer 109 is coated or attached on the supporting structure 108. The light output surface S of the light emitting device 103 faces towards the reflective layer 109. The light generated by the light emitting device 103 is reflected upwards by the reflective layer 109 to enter the film 101, and then is emitted from the outer surface of the film 101 to increase optical effects.

Figure 9C:
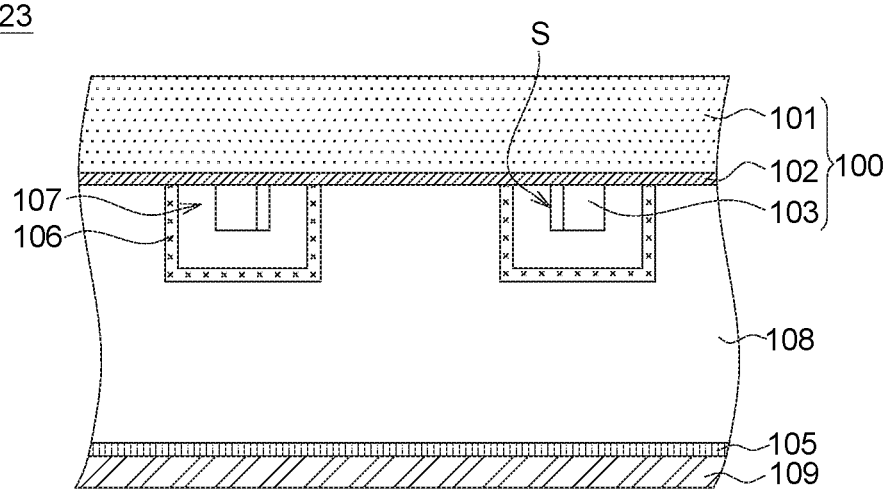
FIG. 9C is a schematic diagram of an electronic product according to another embodiment of the invention.

Refer to FIG. 9C. The electronic product 123 of FIG. 9C and the electronic product 122 of FIG. 9B have similar structures but are different as follows. The surface of the supporting structure 108 may have a reflective layer 109 and a light scattering structure 105 disposed thereon. The light scattering structure 105 can be realized by micro-structures, prism structures or multi-curve lens structures formed on the supporting structure 108. The reflective layer 109 may be coated or attached on the light scattering structure 105. The light generated by the light emitting device 103 is scattered by the light scattering structure 105 and reflected upwards by the reflective layer 109 to enter the film 101, and then is emitted from the outer surface of the film 101 to increase optical effects. Furthermore, as indicated in FIG. 9C, the light emitting device 103 can be realized by a lateral LED device whose light output surface S illuminates from a lateral side of the light emitting device 103. The cavity 107 has a rectangular shape. The inner wall of the cavity 107 may selectively have a light diffusion layer 106 disposed thereon to increase the uniformity of the light.

Figure 10A:
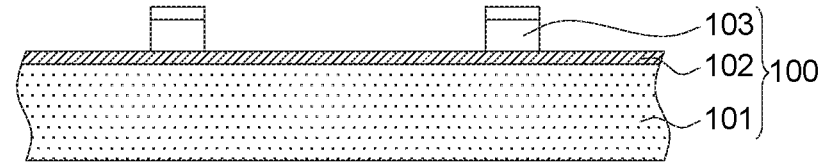
FIGS. 10A-10C are procedures of a manufacturing method of an electronic product according to another embodiment of the invention.
Figure 10B:
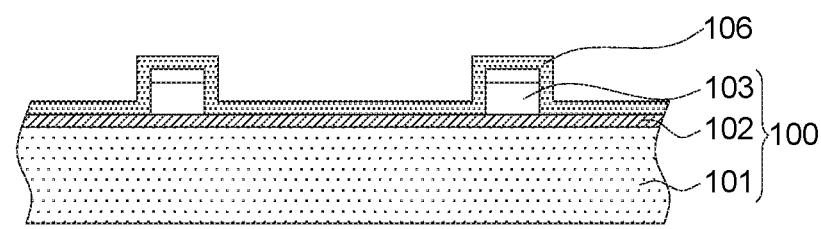
Figure 10C:
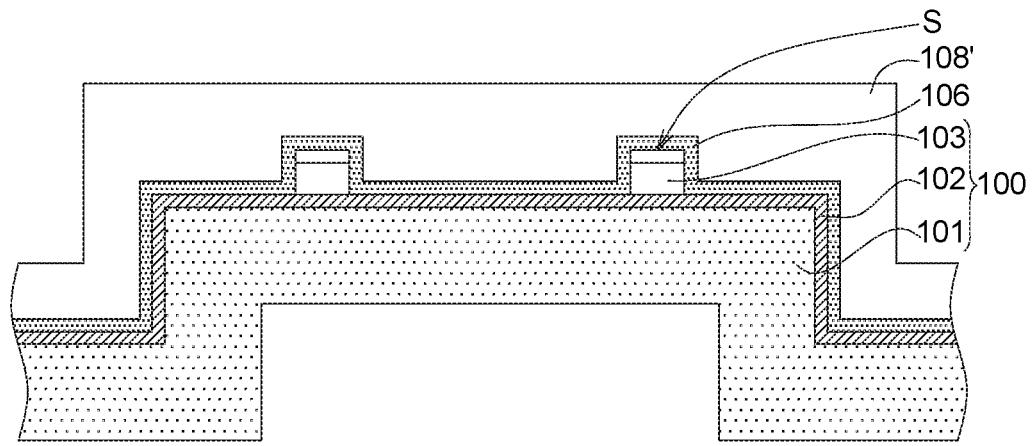

Refer to FIGS. 10A-10C. The manufacturing method of an electronic product 124 according to another embodiment of the invention includes following steps.

As indicated in FIG. 10A, a conductive circuit 102 is formed on a film 101, and a light emitting device 103 is disposed on the conductive circuit 102 to form a light emitting structure 100. Then, as indicated in FIG. 10B, a light diffusion layer 106 is formed to cover the light emitting device 103 and the conductive circuit 102. Apart from enlarging the output angle of the light to increase the uniformity of the light, the light diffusion layer 106 further provides waterproof and dustproof function to avoid the light emitting device 103 being affected by moisture or dusts.

In the present embodiment, the light diffusion layer 106 can be a thermo-formable film, which can be heated and deformed under certain conditions of temperature, vacuum and pressure. The light diffusion layer 106 and the film 101 of the light emitting structure 100 can be pre-bonded by using a high temperature vacuum adsorption method, a heat pressing method, an ultrasonic welding method, an adhering method or an adhesive attaching method to form a composite structure 112 whose shape can be adjusted according to the external appearance of the electronic product.

The thermo-formable material used in the film 101 and/or the light diffusion layer 106 can be formed by polymer compound, such as thermoplastic plastics or thermosetting plastics. The thermoplastic plastics can be heated by multiple thermoforming processes, and the thermosetting plastics can only be heated by a single thermoforming process. Besides, the thermo-formable material used in the film 101 and the light diffusion layer 106 can be the same material or different materials.

Refer to the electronic product 124 of FIG. 10C. After the light diffusion layer 106 and the light emitting structure 100 are bonded to form a composite structure 112, a supporting structure 108' can be formed on the light emitting structure 100 by using an in-mold injection forming method. Thus, the supporting structure 108', the light diffusion layer 106 and the light emitting structure 100 are bonded and stacked to each other, and the light diffusion layer 106 is enclosed between the supporting structure 108' and the light emitting structure 100 and used as a protection layer which prevents the light emitting device 103 from colliding with injected plastics and becoming damaged. Besides, the light output surface S of the light emitting device 103 faces towards the supporting structure 108', and the light generated by the light emitting device 103 can be outputted from the outer surface of the supporting structure 108' via the light diffusion layer 106.

Figure 10D:
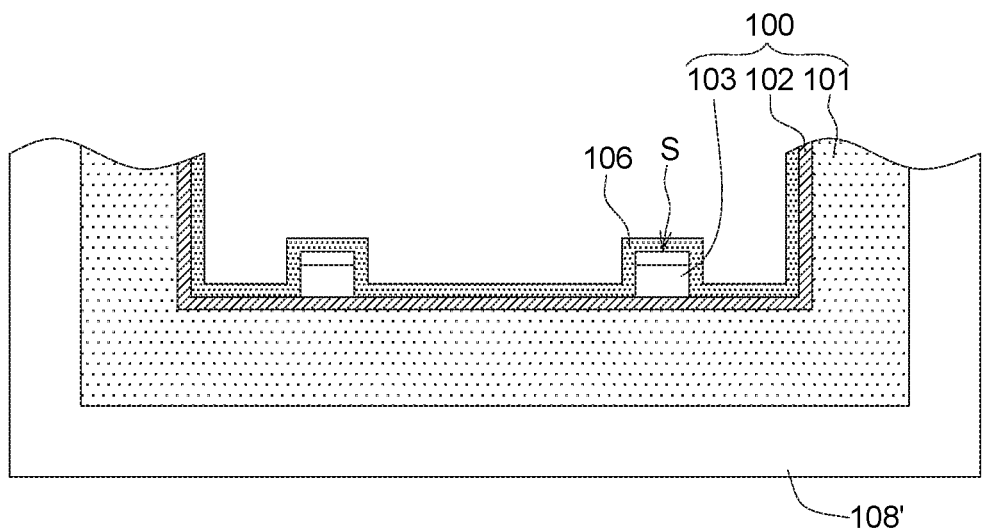
FIG. 10D is a schematic diagram of an electronic product according to another embodiment of the invention.

Refer to FIG. 10D. The electronic product 125 of FIG. 10D and the electronic product 124 of FIG. 10C are different as follows. The supporting structure 108' and the film 101 of the light emitting structure 100 of the composite structure 112 can be bonded by using an in-mold injection forming method, and the film 101 of the light emitting structure 100 is enclosed between the supporting structure 108' and the light diffusion layer 106 to protect the light emitting device 103. In the present embodiment, the film 101 is enclosed between the light emitting device 103 and the supporting structure 108' and used as a buffer layer which protects the light emitting device 103 from colliding with injected plastics and becoming damaged.

Or, as indicated in FIG. 10C, firstly, the supporting structure 108' is made according to a predetermined shape. Then, after the light diffusion layer 106 and the pre-shaped supporting structure 108' are bonded by using the out-mold forming technology, the film 101 of the light emitting structure 100 and the light diffusion layer 106 are bonded together to form an electronic product 124 by using the out-mold forming technology. Or, as indicated in FIG. 10D, firstly, the supporting structure 108' is made according to a predetermined shape. Then, after the film 101 of the light emitting structure 100 and the pre-shaped supporting structure 108' are bonded by using the out-mold forming technology, the film 101 of the light emitting structure and the light diffusion layer 106 are bonded to form an electronic product 125 by using the out-mold forming technology. Or, as indicated in FIG. 10C and FIG. 10D, the composite structure 112 of the light emitting structure 100 and the light diffusion layer 106 can be bonded on the pre-shaped supporting structure 108' by using the out-mold forming technology.

The supporting structure 108' can be formed by polymer compound, metal or ceramics. The supporting structure 108' can be formed by a single material or a composite material. The shape of the supporting structure 108' is not limited to a particular shape, and the shape of the supporting structure 108' can be a 2D structure or a 3D structure. In an embodiment, the supporting structure 108' is a rigid structure, such as a casing, a panel, a dashboard or a frame.

Figure 11A:
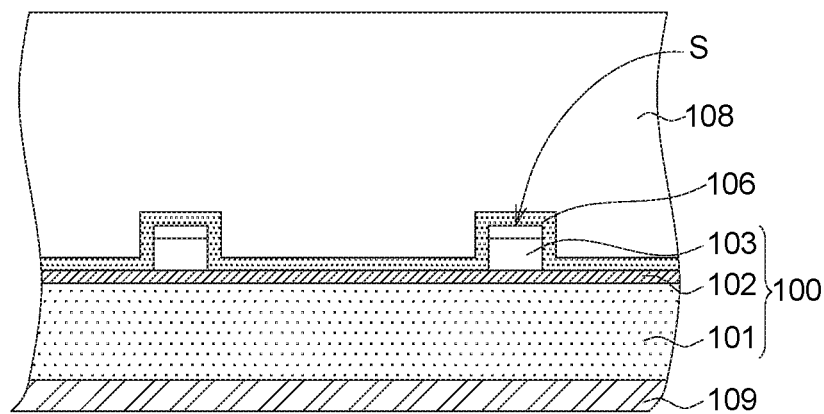
FIG. 11A is a schematic diagram of an electronic product according to another embodiment of the invention.

Refer to FIG. 11A. The electronic product 126 of FIG. 11A and the electronic product 124 of FIG. 10C have similar structures but are different as follows. As indicated in FIG. 11A, the surface of the film 101 may have a reflective layer 109 disposed thereon, and the reflective layer 109 and the light diffusion layer 106 are disposed on two opposite surfaces of the film 101. Besides, the light output surface S of the light emitting device 103 may face towards the light diffusion layer 106 or face towards the reflective layer 109 (not illustrated). A part of the light generated by the light emitting device 103 is reflected upward by the reflective layer 109 and is then emitted from the outer surface of the supporting structure 108 via the light diffusion layer 106 to increase the uniformity of the light.

Figure 11B:
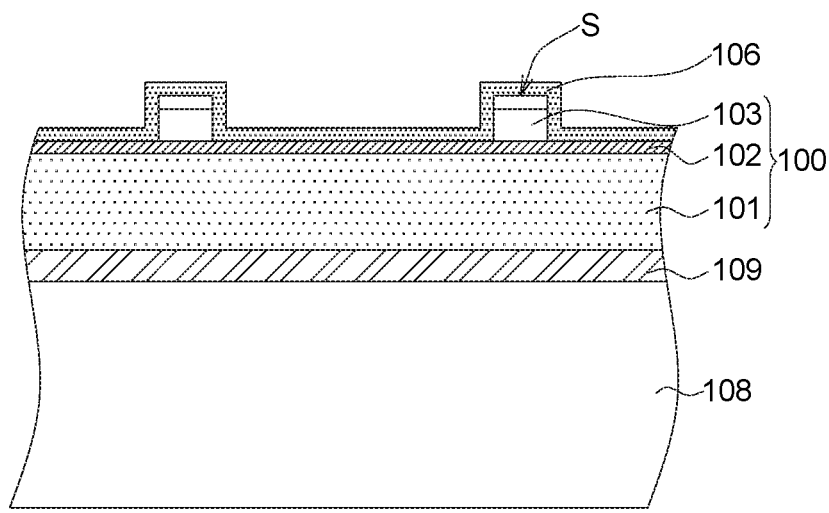
FIG. 11B is a schematic diagram of an electronic product according to another embodiment of the invention.

Refer to FIG. 11B. The electronic product 127 of FIG. 11B and the electronic product 125 of FIG. 10D have similar structures but are different as follows. As indicated in FIG. 11B, a reflective layer 109 can be enclosed between the supporting structure 108 and the film 101 of the light emitting structure 100. The reflective layer 109 and the light diffusion layer 106 are disposed on two opposite surfaces of the film 101, and the reflective layer 109 is coated or attached between the film 101 and the supporting structure 108 to increase the uniformity of the light. Besides, the light output surface S of the light emitting device 103 may face towards the light diffusion layer 106 or face towards the reflective layer 109 (not illustrated). A part of the light generated by the light emitting device 103 is reflected upward by the reflective layer 109 and is then emitted from the outer surface of the supporting structure 108 via the light diffusion layer 106 to increase the uniformity of the light.

Figure 12:
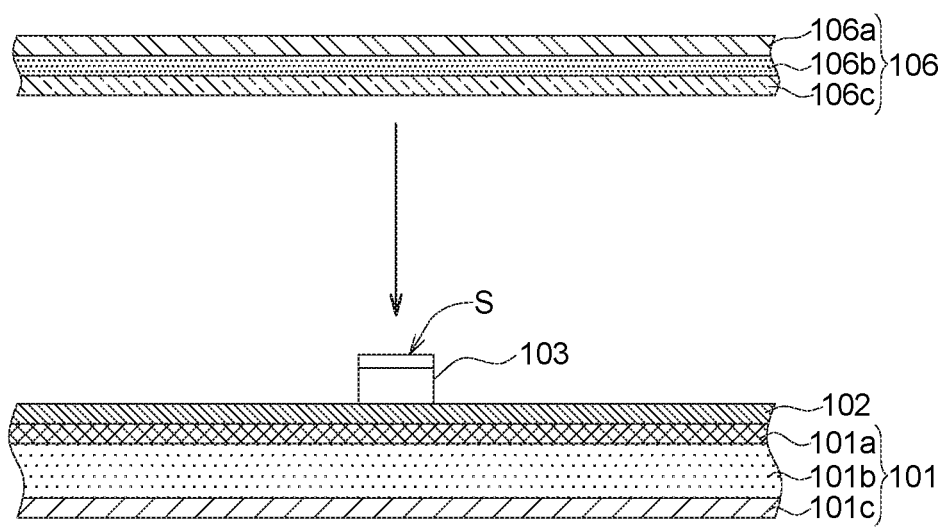
FIG. 12 is a schematic diagram of a film having a function film and a light diffusion layer having a function film bonded together.

Refer to FIG. 12. The film 101 can be formed of a single film or a laminated layer formed by multiple films stacked to each other. In an embodiment, the film 101 includes a first function film 101a, a thermo-formable film 101b and a second function film 101c stacked in sequence. The first function film 101a and the second function film 101c can be disposed on any one surface of the thermo-formable film 101b. In an embodiment, the first function film 101a can be at least one of a decorative layer, a heat conducting layer and a shielding layer. The second function film 101c can be at least one of a decorative layer, a heat conducting layer and a shielding layer. The first function film 101a and the second function film 101c can have the same or different functions. The first function film 101a and the second function film 101c can be formed by way of screen printing, offset printing, gravure printing, flexographic printing, transfer printing, carving printing or other methods. The film 101 can have none, one, or both of the first function film 101a and the second function film 101c according to the features of the electronic product. Furthermore, the light emitting device 103 has a light output surface S. When the light output surface S faces towards the film 101, the conductive circuit 102 can be formed of a translucent conductive material or have an opening allowing the light to pass therethrough, and the first function film 101a, the thermo-formable film 101b and the second function film 101c can all have a translucency feature.

Refer to FIG. 12, the light diffusion layer 106 can be formed by a single film or a laminated layer formed by multiple films stacked to each other. In an embodiment, the light diffusion layer 106 includes a third function film 106a, a thermo-formable film 106b and a fourth function film 106c stacked in sequence. The third function film 106a and the fourth function film 106c can be at least one of the decorative layer, the heat conducting layer and the shielding layer, and can be disposed on any one surface the thermo-formable film 106b. The light diffusion layer 106 can have none, one, or both of the third function film 106a and the fourth function film 106c according to the features of the electronic product. Besides, when the light output surface S of the light emitting device 103 faces towards the light diffusion layer 106, the third function film 106a, the thermo-formable film 106b and the fourth function film 106c can all are translucent.

An electronic product with a light emitting function and a method for manufacturing the same are disclosed in above embodiments of the invention. Firstly, a light emitting device is received in a cavity or is enclosed between a light diffusion layer and a film. Then, the light emitting structure and a supporting structure are bonded and stacked to each other by using an in-mold forming technology or an out-mold forming technology to enhance the protection for the light emitting device and avoid the light emitting device colliding with injected plastic material and becoming damaged. Moreover, the light diffusion layer and/or the film of the invention, formed by using the in-mold forming or the out-mold forming technology, have waterproof and dust-proof function, and can adaptively include at least one function film such as a decorative layer, a heat conducting layer, or a shielding layer. Furthermore, the in-mold forming technology or the out-mold forming technology used in the invention can be used in products having complicated 2D or 3D structure and can provide a packaging effect which makes the bonded structure difficult to be separated or removed, and therefore increases the reliability of the products.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electronic product with a light emitting function, comprising:
    a light emitting structure comprising a polymer film, a conductive circuit and a light emitting device, wherein the conductive circuit is formed on the polymer film, and the light emitting device is disposed on the conductive circuit; and
    a supporting structure having a cavity and bonded on the conductive circuit of the light emitting structure to enclose the light emitting device, wherein the light emitting device is received in the cavity, wherein a periphery, a top and a bottom of the cavity is fully enclosed by the supporting structure and the conductive circuit,
    wherein the cavity is formed by a notch indented into the supporting structure, and the supporting structure and the polymer film are bonded together by using an out-mold forming technology.

2. The electronic product according to claim 1, further comprising a concave plate covering the light emitting structure, wherein the supporting structure and the light emitting structure having the concave plate are bonded together, such that the concave plate is enclosed between the supporting structure and the light emitting structure.

3. The electronic product according to claim 2, further comprising a light scattering structure or a light diffusion layer disposed on an inner wall of the cavity.

4. The electronic product according to claim 1, wherein the polymer film is a thermoforming film having at least one function film or a reflective layer, or the supporting structure has the reflective layer, the light emitting device has a light output surface facing towards the reflective layer, and the at least one function film is selected from at least one of a decorative layer, a heat conducting layer and a shielding layer.

5. The electronic product according to claim 1, wherein the polymer film and the conductive circuit are formed by a flexible board having the conductive circuit thereon.

6. The electronic product according to claim 1, wherein a patterned ink layer having a circuit pattern and a conductive metal layer are disposed on the polymer film, and the conductive metal layer is fixed on the patterned ink layer to form the conductive circuit having the circuit pattern on the polymer film.

7. The electronic product according to claim 1, wherein a conductive metal layer having a circuit pattern is disposed on the polymer film, and the conductive metal layer has an adhesive through which the conductive metal layer is fixed on the polymer film to form the conductive circuit having the circuit pattern on the polymer film.

8. The electronic product according to claim 1, wherein a patterned adhesive layer and a conductive metal layer are disposed on the polymer film, the patterned adhesive layer is formed on the polymer film, and the conductive metal layer is fixed on the patterned adhesive layer to form the conductive circuit having a circuit pattern on the polymer film.

9. An electronic product with a light emitting function, comprising:
    a supporting structure;
    a light emitting structure bonded on the supporting structure, wherein the light emitting structure comprises a polymer film, a conductive circuit and a light emitting device, the conductive circuit is formed on the polymer film, and the light emitting device is disposed on the conductive circuit; and
    a light diffusion layer covering the light emitting device and the conductive circuit, wherein the supporting structure, the light emitting structure and the light diffusion layer are bonded and stacked to each other, and a periphery, a top and a bottom of the light diffusion layer is enclosed between the supporting structure and the polymer film of the light emitting structure, or a periphery, a top and a bottom of the polymer film of the light emitting structure is enclosed between the supporting structure and the light diffusion layer.

10. The electronic product according to claim 9, wherein at least one of the polymer film and the light diffusion layer has at least one function film, or the polymer film has a reflective layer, or the reflective layer is enclosed between the polymer film and the supporting structure, the reflective layer and the light diffusion layer are disposed on two opposite surfaces of the polymer film, and the at least one function film is selected from at least one of a decorative layer, a heat conducting layer and a shielding layer.

11. The electronic product according to claim 9, wherein the polymer film and the conductive circuit are formed by a flexible board having the conductive circuit.

12. The electronic product according to claim 9, wherein a patterned ink layer and a conductive metal layer are disposed on the polymer film, and the conductive metal layer is fixed on the patterned ink layer to form the conductive circuit having a circuit pattern on the polymer film.

13. The electronic product according to claim 9, wherein a conductive metal layer having a circuit pattern is disposed on the polymer film, and the conductive metal layer contains an adhesive through which the conductive metal layer is fixed on the polymer film to form the conductive circuit having the circuit pattern on the polymer film.

14. The electronic product according to claim 9, wherein a patterned adhesive layer and a conductive metal layer are disposed on the polymer film, the patterned adhesive layer is formed on the polymer film, and the conductive metal layer is fixed on the patterned adhesive layer to form the conductive circuit having a circuit pattern on the polymer film.

15. A manufacturing method of an electronic product, comprising:

forming a conductive circuit on a polymer film;

disposing a light emitting device on the conductive circuit, so that a light emitting structure is constructed by the polymer film, the conductive circuit and the light emitting device; and bonding a supporting structure having a cavity on the conductive circuit of the light emitting structure to enclose the light emitting device, wherein the light emitting device is received in the cavity, wherein a periphery, a top and a bottom of the cavity is fully enclosed by the supporting structure and the conductive circuit, wherein the cavity is formed by a notch indented into the supporting structure, and the supporting structure and the polymer film are bonded together by using an out-mold forming technology.

16. The manufacturing method of an electronic product according to claim 15, further comprising covering the light emitting structure by a concave plate, wherein the concave plate is bonded on the conductive circuit of the light emitting structure by using a high temperature vacuum adsorption method, a heat pressing method, an ultrasonic welding method, a gluing method or an adhesive attaching method, and the supporting structure and the light emitting structure having the concave plate are bonded together, such that the concave plate is enclosed between the supporting structure and the light emitting structure.

17. The manufacturing method of an electronic product according to claim 15, wherein the step of forming the conductive circuit comprises:

forming a patterned ink layer on the polymer film, wherein the patterned ink layer has a circuit pattern;

placing a conductive metal layer on the patterned ink layer; and heating a stamping plate and further pressing the conductive metal layer by the stamping plate, such that a part of the conductive metal layer is heated and attached on the patterned ink layer to form the conductive circuit having the circuit pattern on the polymer film.

18. The manufacturing method of an electronic product according to claim 15, wherein the step of forming the conductive circuit comprises:

forming a conductive metal layer on a Toppan stamping plate, wherein a circuit pattern is formed through a protrusion of the Toppan stamping plate, and the conductive metal layer contains an adhesive;

placing the polymer film on the conductive metal layer; and heating the Toppan stamping plate and further pressing the conductive metal layer by the Toppan stamping plate, such that a part of the conductive metal layer is heated and attached on the polymer film to form the conductive circuit having the circuit pattern on the polymer film.

19. The manufacturing method of an electronic product according to claim 15, wherein the step of forming the conductive circuit comprises:

forming a conductive metal layer having a circuit pattern on the polymer film, wherein the conductive metal layer contains an adhesive; and heating a stamping plate and further pressing the conductive metal layer by the stamping plate, such that the conductive metal layer having the circuit pattern is heated and attached on the polymer film to form the conductive circuit on the polymer film.

20. The manufacturing method of an electronic product according to claim 15, wherein the step of forming the conductive circuit comprises:

forming a patterned adhesive layer on the polymer film, wherein the patterned adhesive layer has a circuit pattern;

placing a conductive metal layer on the patterned adhesive layer; and pressing the conductive metal layer by a pressure plate, such that the conductive metal layer is pressed and fixed on the patterned adhesive layer and the patterned adhesive layer is irradiated by light and is cured so as to form the conductive circuit having the circuit pattern on the polymer film having the patterned adhesive layer.

21. The manufacturing method of an electronic product according to claim 15, wherein the step of forming the conductive circuit comprises:

forming a patterned adhesive layer on a protrusion of a Toppan pressure plate or an indentation of an Intaglio pressure plate, wherein the protrusion of the Toppan pressure plate or the indentation of the Intaglio pressure plate has a circuit pattern;

placing the polymer film on the patterned adhesive layer, such that the patterned adhesive layer is pressed and transferred on the polymer film;

placing a conductive metal layer on the patterned adhesive layer; and pressing the conductive metal layer by a pressure plate, such that the conductive metal layer is pressed and fixed on the patterned adhesive layer and the patterned adhesive layer is irradiated by light and cured so as to form the conductive circuit having the circuit pattern on the polymer film having the patterned adhesive layer.

22. A manufacturing method of an electronic product, comprising:

forming a conductive circuit on a polymer film;

disposing a light emitting device on the conductive circuit, so that a light emitting structure is constructed by the polymer film, the conductive circuit and the light emitting device;

forming a light diffusion layer to cover the light emitting device and the conductive circuit; and forming a supporting structure, wherein the supporting structure, the light emitting structure and the light diffusion layer are bonded and stacked to each other, and a periphery, a top and a bottom of the light diffusion layer is enclosed between the supporting structure and the polymer film of the light emitting structure, or a periphery, a top and a bottom of the polymer film of the light emitting structure is enclosed between the supporting structure and the light diffusion layer.

23. The manufacturing method of an electronic product according to claim 22, wherein the step of bonding and stacking the supporting structure, the light emitting structure and the light diffusion layer comprises:

bonding the light diffusion layer and the polymer film together to form a composite structure by using a high temperature vacuum adsorption method, a heat pressing method, an ultrasonic welding method, an adhering method or an adhesive attaching method; and bonding the polymer film or the light diffusion layer of the composite structure and the supporting structure together by using an out-mold forming technology.

24. The manufacturing method of an electronic product according to claim 22, wherein the step of bonding and stacking the supporting structure, the light emitting structure and the light diffusion layer comprises:
   bonding the light diffusion layer and the polymer film together to form a composite structure by using a high temperature vacuum adsorption method, a heat pressing method, an ultrasonic welding method, an adhering method or an adhesive attaching method;
   bonding the supporting structure and the polymer film or the light diffusion layer of the composite structure together by using an in-mold injection forming method.

25. The manufacturing method of an electronic product according to claim 22, wherein the step of bonding and stacking the supporting structure, the light emitting structure and the light diffusion layer comprises:
   pre-bonding the polymer film or the light diffusion layer and the supporting structure together by using an out-mold forming technology; and
   bonding the polymer film and the light diffusion layer together by using the out-mold forming technology.

* * * * *